United States Patent [19]
Hwang

[11] Patent Number: 6,026,030
[45] Date of Patent: Feb. 15, 2000

[54] STRUCTURE FOR ECHO IC

[75] Inventor: Kenny Hwang, Taipei Hsien, Taiwan

[73] Assignee: Princeton Technology Corp., Taipei Hsien, Taiwan

[21] Appl. No.: 09/054,504

[22] Filed: Apr. 3, 1998

[51] Int. Cl.[7] .................................................. G11C 16/04
[52] U.S. Cl. ............................... 365/189.01; 365/189.04; 365/233
[58] Field of Search ........................ 365/189.01, 189.04, 365/189.11, 230.01, 233

[56] References Cited

U.S. PATENT DOCUMENTS

| | | | |
|---|---|---|---|
| 5,255,220 | 10/1993 | Filliman | 365/189.04 |
| 5,701,267 | 12/1997 | Masuda et al. | 365/201 |
| 5,812,476 | 9/1998 | Segawa | 365/222 |

*Primary Examiner*—David Nelms
*Assistant Examiner*—David Lam
*Attorney, Agent, or Firm*—Bacon & Thomas

[57] ABSTRACT

A new structure for an echo IC that employs a DRAM, so as to have the function of a shift register. The number of transistors in a storage cell is reduced, and only a single type of transistor (e.g. NMOS or PMOS) is used, so as to simplify the manufacturing process, decrease the volume of echo IC dramatically, and reduce the cost. The matrix of storage cells and related clock signals are rearranged so that and the amplitude of power spikes can be lowered to decrease noise, the frequency of power spikes is also increased so that a low cost filter can be employed.

10 Claims, 6 Drawing Sheets

STRUCTURE FOR ECHO IC

FIELD OF THE INVENTION

The present invention relates to a new structure for an echo IC (integrated circuit), and more particularly to a new structure for an echo IC that employs a dynamic random access memory (DRAM) instead of a static random access memory (SRAM).

BACKGROUND OF THE INVENTION

An echo IC currently used in karaoke related products uses an SRAM to store audio information for the delay effect. However, each cell of the echo IC needs 6 transistors, as shown in FIG. 1, including 2 PMOS transistors and 4 NMOS transistors. An echo IC can not be miniaturized with so many transistors. Also because of different structures between PMOS and NMOS, the manufacturing process is complicated, and the cost cannot be reduced.

OBJECTS OF THE INVENTION

It is therefore an object of the present invention to provide a new structure for an echo IC by employing a DRAM to act as a shift register, and reducing the number of transistors in each cell of the echo IC, using a single type of transistor (e.g. NMOS or PMOS), so as to simplify the related manufacturing process, reduce the volume of the echo IC dramatically, and decrease the manufacturing cost.

It is another object of the present invention to rearrange the structure of the echo IC, including the ting clock signal and the matrix of storage cells, so as to reduce the amplitude of related power spikes, decrease unnecessary noise, and increase the frequency of noise so that a low cost filter can be employed.

BRIEF DESCRIPTION OF THE DRAWINGS

The present invention can be better understood by detailed description of the following drawings, in which.

DETAILED DESCRIPTION OF THE INVENTION

Figure 1:
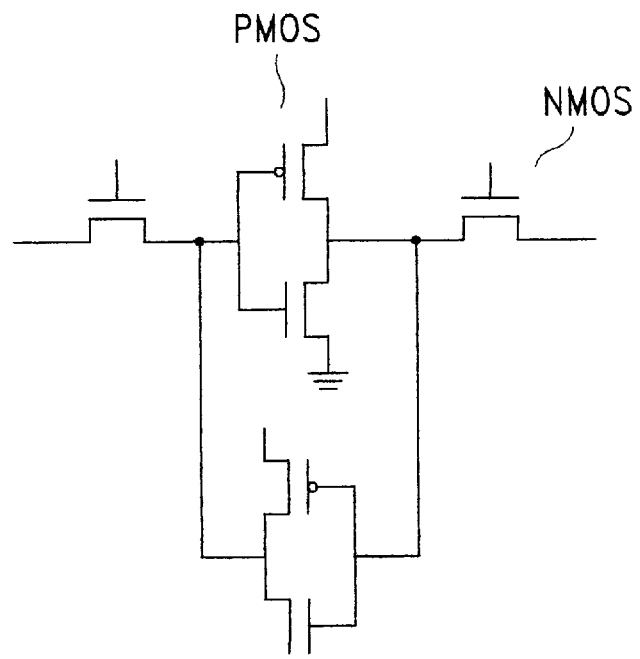
FIG. 1 is a schematic diagram showing a conventional storage cell of a echo IC.
Figure 2:
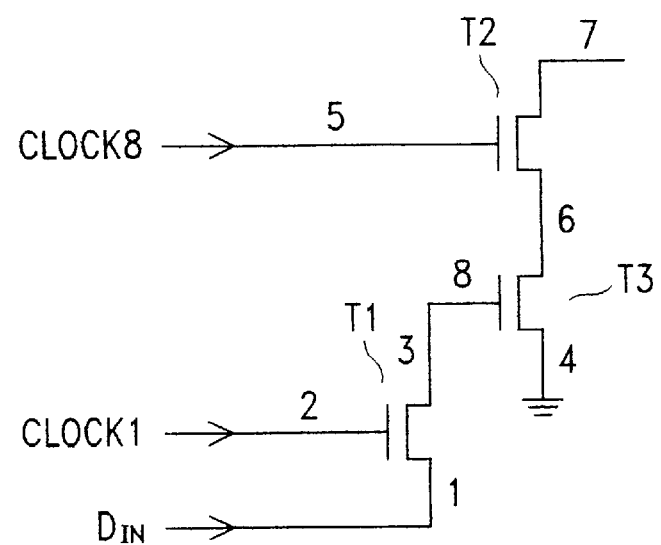
FIG. 2 is a schematic diagram showing a storage cell of the echo IC according to the present invention.

FIG. 2 is a schematic diagram showing a storage cell of an echo IC that employs a DRAM instead of an SRAM according to the present invention. As shown in the figure, only 3 NMOS are used without any PMOS, so the manufacturing process is very simple and the IC volume is reduced.

The operation of the storage cell is explained as below. Digital pulse data $D_{in}$ (with waveform shown in FIG. 3) are first inputted into the source 1 (input terminal) of T1, and then pulse signal CLOCK 1 is inputted into the gate 2 (write terminal) of T1, so as to cause the source 1 and drain 3 of T1 to be conducting, and thus $D_{in}$ is sent to the gate 8 of T3 for storage. Therefore, CLOCK 1 is a write operation. When Clock 8 is inputted into the gate 5 (read terminal) of T2, the source 6 and the drain 7 of T2 will be conducting, and the $D_{in}$ stored in gate 8 of T3 will cause the source 4 and the drain 6 of T3 to be conducting, so the ground potential of the source 4 of T3 will be sent to the drain 7 (output terminal) of T2. Therefore, CLOCK 8 is a read operation.

Figure 3:
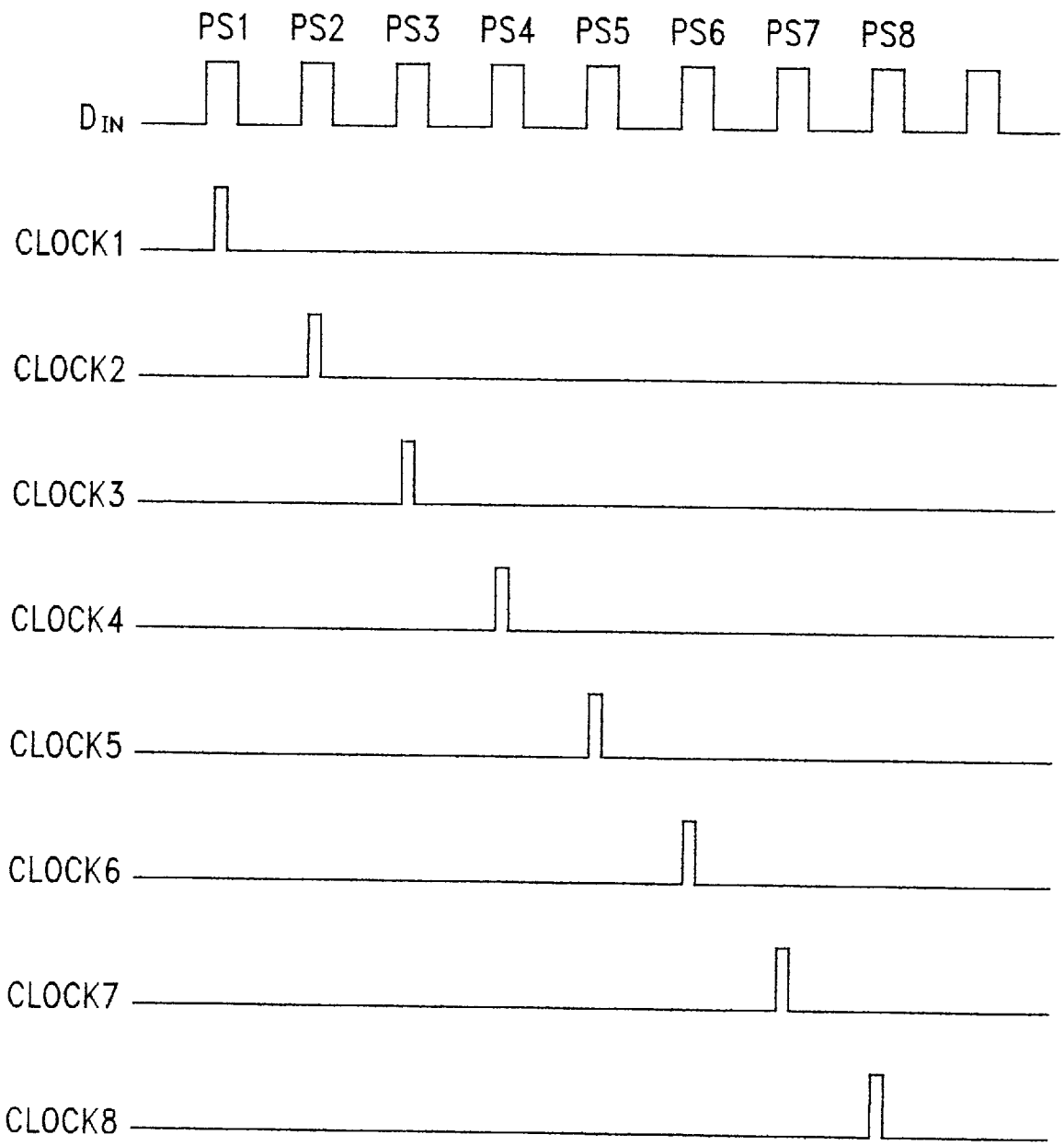
FIG. 3 is a schematic diagram showing a set of digital pulse data and related clock signals according to the present invention.
Figure 4:
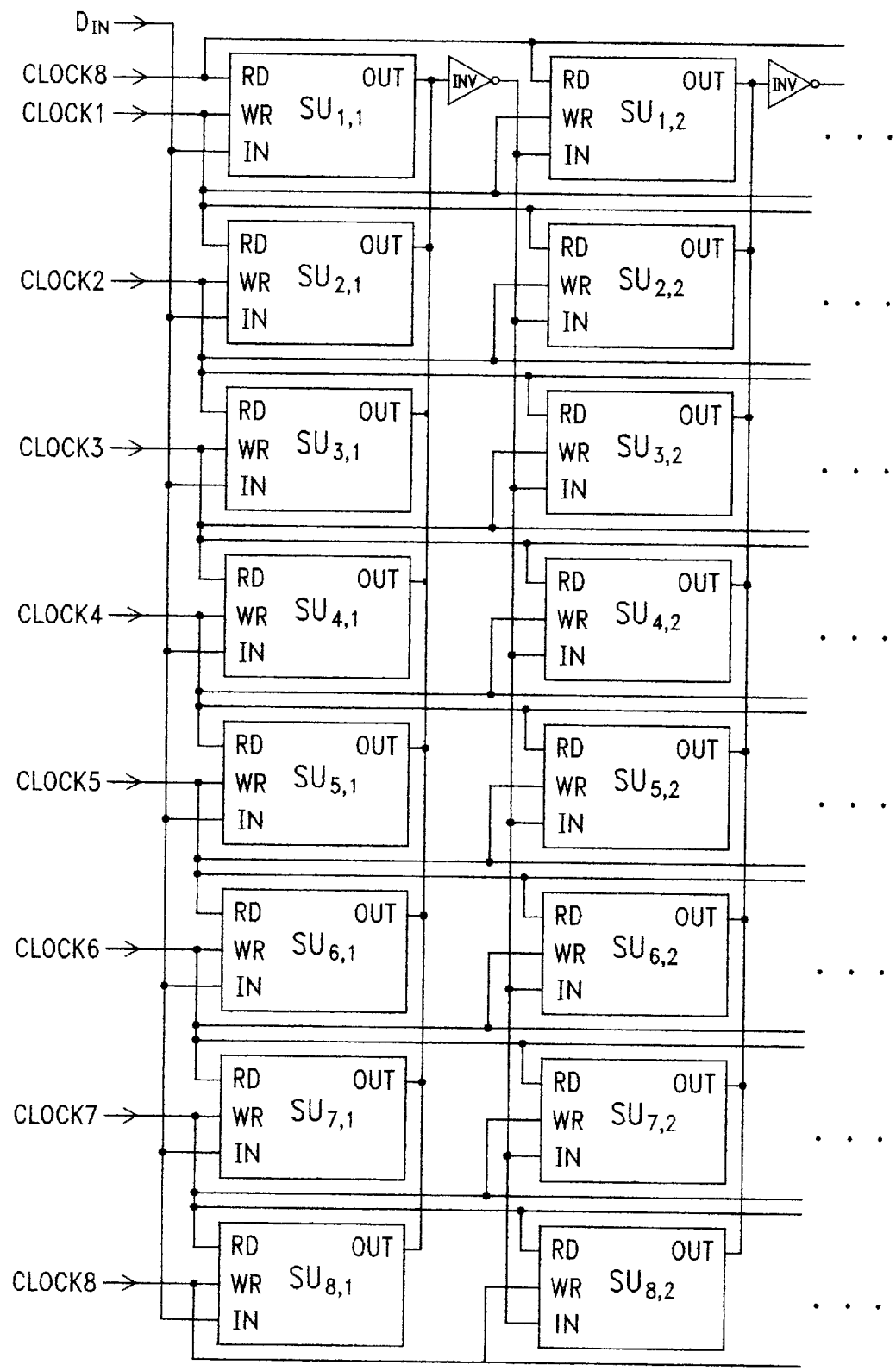
FIG. 4 is a schematic diagram showing a matrix of the storage cell according to the present invention.

Referring to FIG. 4, which is a schematic diagram showing a matrix of the storage cell according to the present invention. The matrix comprises 8 rows and 6,000 columns with a total of 48,000 storage cells. Only 2 columns of the matrix are shown for explanation. FIG. 3 shows the waveforms of Din, CLOCK 1, . . . CLOCK 8. Every pulse in CLOCK 1, . . . CLOCK 8 are phase shifted sequentially by a time which are equal to the period of the pulse in $D_{in}$, and each CLOCK pulse is within the pulse width of the related $D_{in}$ pulse. CLOCK 1, . . . CLOCK 8 are cyclical, so CLOCK 8 will again be followed with CLOCK 1. Digital pulse data $D_{in}$ is generated by analog-digital conversion of the speech signal, and is inputted into each IN (input) terminal (i.e. the source 1 of T1 in FIG. 2) of the 8 storage cells ($SU_{1,1}$~$SU_{8,1}$) in the first column. CLOCK 8 is inputted into each RD (read) terminal (i.e. the gate 5 of T2 in FIG. 2) of the 6,000 storage cells ($SU_{1,1}$~$SU_{1,6000}$) in the first row.

CLOCK 1 is inputted into each WR (write) terminal (i.e. the gate 2 of T1 in FIG. 2) of the 6,000 storage cells ($SU_{1,1}$~$SU_{1,6000}$) in the first row, and also inputted into each RD (read) terminal (i.e. the gate 5 of T2 in FIG. 2) of the 6,000 storage cells ($SU_{2,1}$~$SU_{2,6000}$) in the second row, and so on for the rest of the CLOCK 2, . . . CLOCK 8. In other words, each CLOCK signal will not only be inputted into each WR terminal of 6,000 storage cells of a row, but also be inputted into each RD terminal of 6,000 storage cells of the next row. The OUT terminals (i.e. the drain 7 of T2 in FIG. 2) of the 8 storage cells in column 1 ($SU_{1,1}$~$SU_{8,1}$) are interconnected 10 to an inverter INV to be connected to each IN terminal of the 8 storage cells in the next column, and so on for the other columns.

The first pulse PS1 of digital pulse data $D_{in}$ (as shown in FIG. 3) will be inputted into the 8 storage cells ($SU_{1,1}$~$SU_{8,1}$) of the first column firstly, and then CLOCK 1 will be inputted into each WR terminal of the 6,000 storage cells ($SU_{1,1}$~$SU_{1,6000}$) of the first row, and also inputted into each RD terminal of the 6,000 storage cells ($SU_{2,1}$~$SU_{2,6000}$) of the second row, and thus PS1 will be inputted to gate 8 of T3 in $SU_{1,1}$ for storage. At this time, other storage cells still have no operation, since the related CLOCKs have not arrived. Next, the second pulse PS2 will be inputted into the 8 storage cells ($SU_{1,1}$~$SU_{8,1}$) of the first column, and then CLOCK 2 will be inputted into each WR terminal of the 6,000 storage cells ($SU_{2,1}$~$SU_{2,6000}$) of the second row, and also inputted into each RD terminal of the 6,000 storage cells ($SU_{3,1}$~$SU_{3,6000}$) of the third row, and thus PS2 will be inputted to gate 8 of T3 in $SU_{2,1}$ for storage, while other storage cells will have no operation. Progressing in this way for 8 times, $SU_{1,1}$~$SU_{8,1}$ will be sequentially stored with a related pulse data of $D_{in}$. The $9^{th}$ time will again be CLOCK 1.

When CLOCK 8 is inputted into each RD terminal of the 6,000 storage cells ($SU_{1,1}$~$SU_{1,6000}$) of the first row, the OUT terminal of $SU_{1,1}$ will become a ground potential (since the ground potential of source 4 in T3 is sent to drain 7 of T2), so INV will output a positive pulse as a delayed PS1 to be inputted into the 8 storage cells ($SU_{1,2}$~$SU_{8,2}$) of the second column. When the next pulse CLOCK 1 arrives, not only is a second PS1 data is again stored in $SU_{1,1}$, but also the first delayed PS1 is stored in $SU_{1,2}$. Furthermore, since CLOCK 1 is also inputted into RD terminal of $SU_{2,1}$, OUT terminal of $SU_{2,1}$ will become a ground potential (since the ground potential of source 4 in T3 is sent to drain 7 of T2), so INV will output a positive pulse as a delayed PS2 to be inputted into the 8 storage cells ($SU_{1,2}$~$SU_{8,2}$) of the second column, and will be stored in $SU_{2,2}$ when CLOCK 2 arrives.

By repeated processing in this way, in each cycle (CLOCK 1~CLOCK 8) there will be 8 pulses of data of $D_{in}$ to be pushed to the 8 storage cells of the next column. Actually the above operation is going on for 6,000 storage cells of each row simultaneously, and the digital pulse data Din will therefore be outputted gradually from the OUT terminal of the last column. In other words, the structure of the present invention has the function of shift register, so as to achieve the delay effect of the digital pulse data. In addition, it is noted that each clock signal is maintained within each related pulse or delayed pulse of the digital pulse data.

The advantage of this new structure is in that the digital pulse data is divided into 8 groups (actually the group number is not limited to 8) to achieve the delay effect, and obtain a better echo function during feedback. Furthermore, refresh operation is not needed by this DRAM structure, since refresh operation is achieved during data pushing between columns.

Figure 5:
FIG. 5 is a schematic diagram showing the spikes generated in the power due to the effect of digital pulse data.

However, the above structure still has a shortcoming. Since each time there will be 6,000 pulse data to be pushed, this will cause very big spikes to be generated in system power, as shown in FIG. 5. Such big spikes will definitely influence the voice quality of the echo IC.

Figure 8:
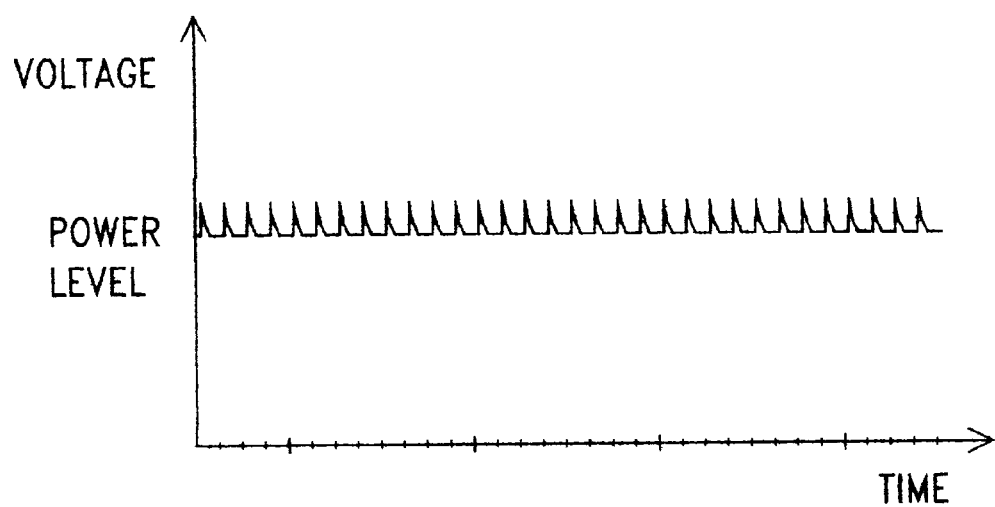
FIG. 8 is a schematic diagram showing that the spikes generated in the power of the present invention due to the effect of digital pulse data is improved.
Figure 6:
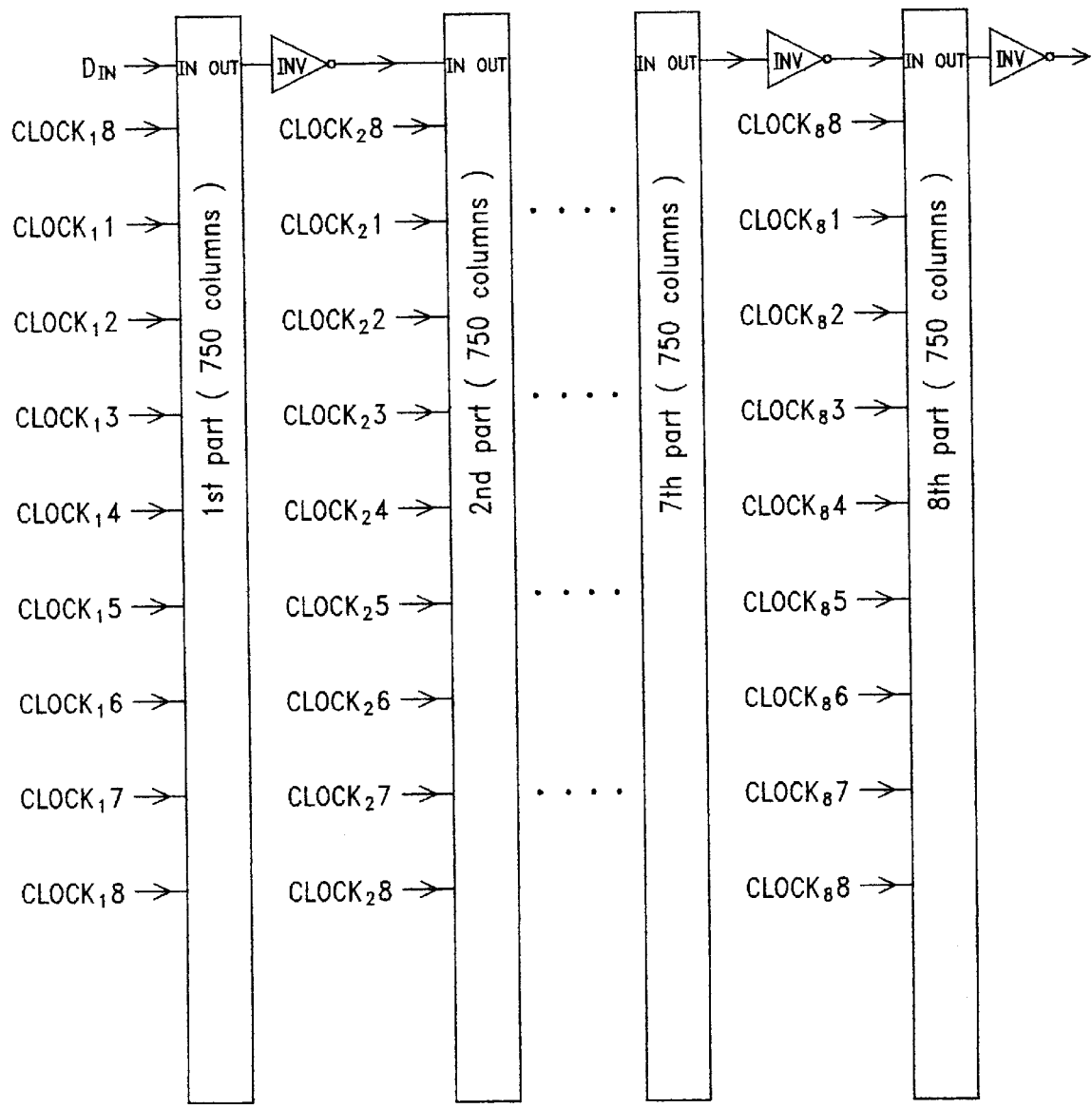
FIG. 6 is a schematic diagram showing that the matrix of the storage cell of the present invention is further divided longitudinally into 8 parts.
Figure 7:
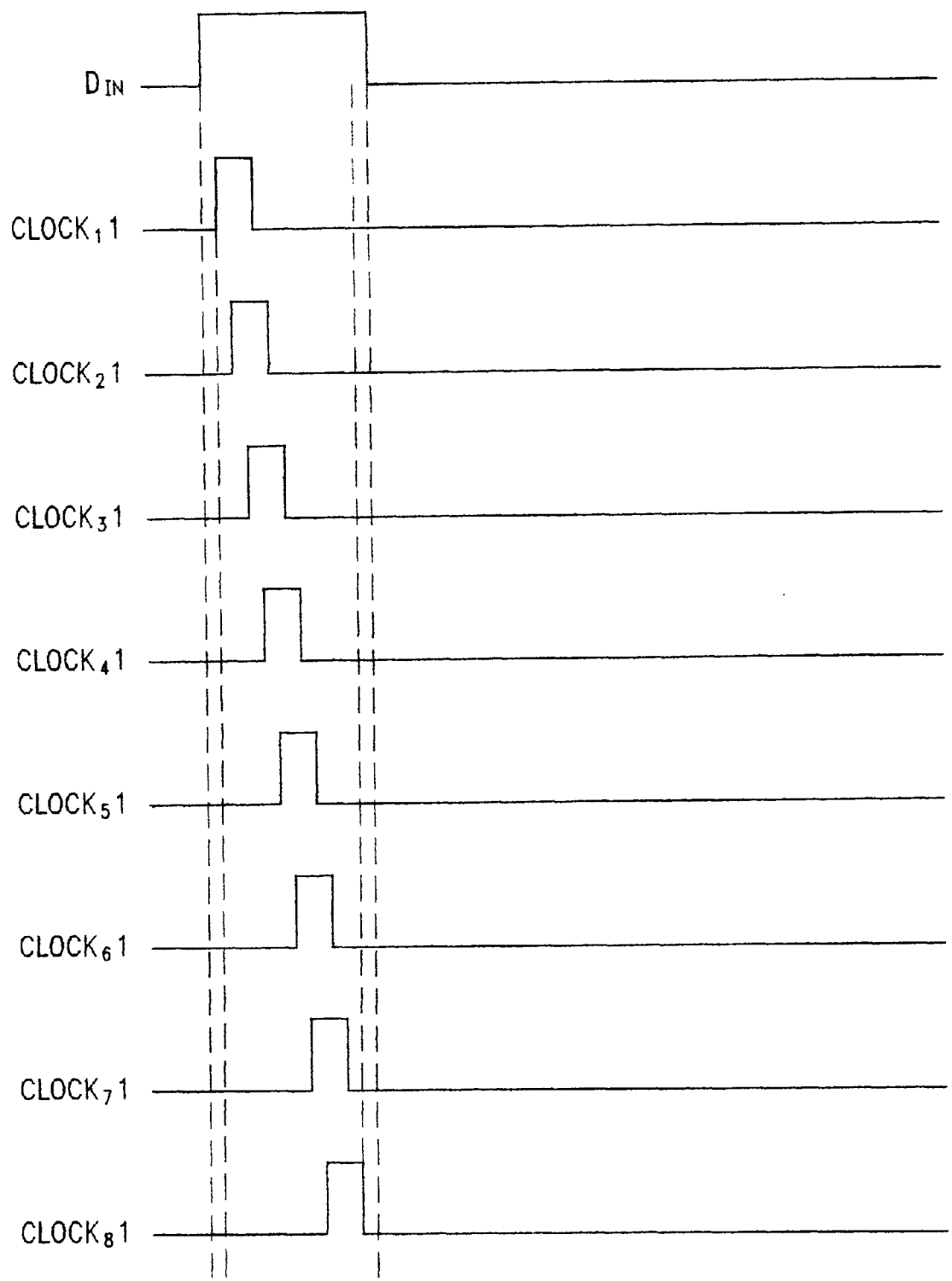
FIG. 7 is a schematic diagram showing that different sets of clock signals are phase shifted.

The present invention is therefore to improve the above structure. As shown in FIG. 6, the matrix of the storage cell is further divided longitudinally into 8 parts. Each part has 750 columns, and connection between each part still exists, but the clock signals for each part are different. As shown in FIG. 7, $CLOCK_1$ 1, $CLOCK_2$ 1, $CLOCK_3$ 1, $CLOCK_4$ 1, $CLOCK_5$ 1, $CLOCK_6$ 1, $CLOCK_7$ 1, $CLOCK_8$ 1 represent the CLOCK 1 for each part (other CLOCK 2~CLOCK 8 are similarly represented with respect to), and are sequentially phase shifted each other for a fixed time, such that each clock signal is still maintained within related pulse data or the delayed pulse data of Din. Therefore, each clock signal will drive only 750 pulses of data, so as to reduce the amplitude of the spike in system power. Referring to FIG. 8, the frequency of the spike is also improved to be 8 times that of the original structure, and is beyond the frequency response of human ear, so a simple filter can be used to save the cost.

It is no doubt that after reading the above descriptions any skillful person in the art can create many different variations without departing the spirit and scope of the accompanying claim. Therefore, it is intended that the appended claims will cover all those variations.

I claim:

1. An echo IC, comprising:

a plurality of storage cells arranged into an N×M matrix, each of said storage cells including a dynamic random access memory (DRAM) and N and M being positive integers;

a plurality of clock signal inputs to said matrix; and a plurality of write terminals, read terminals, input terminals, and output terminals connected to respective said storage cells;

wherein said matrix is arranged to be driven by N different clock signals to cause a series of digital pulse data is inputted into said matrix and outputted from said matrix, wherein each of said N different clock signals has a same period T and said N different clock signals are sequentially phase shifted one after another by a time T/N, wherein each pulse of said digital pulse data is separated by said time T/N, wherein each of said N different clock signals is maintained within a related pulse or delayed pulse of said digital pulse data, and wherein each of said N different clock signals drives each write terminal of N×M matrix storage cells of a related row and drives each read terminal of M storage cells of the next row, while said digital pulse data is inputted into each input terminal of the storage cells of the first column, each output terminal of the storage cells in each column are interconnected to an inverter, and an output of said inverter is connected to each input terminal of the storage cells of the next column.

2. An echo IC as claimed in claim 1, wherein each of said storage cells includes only NMOS transistors.

3. An echo IC as claimed in claim 2, wherein a number of said NMOS transistors in each of said storage cells is three.

4. An echo IC as claimed in claim 1, wherein each of said storage cells includes only PMOS transistors.

5. An echo IC as claimed in claim 4, wherein a number of said PMOS transistors in each of said storage cells is three.

6. An echo IC, comprising:

a plurality of storage cells arranged into an N×M matrix, each of said storage cells including a dynamic random access memory (DRAM) and N and M being positive integers;

a plurality of clock signal inputs to said matrix; and a plurality of write terminals, read terminals, input terminals, and output terminals connected to respective said storage cells;

wherein said matrix is further divided longitudinally into P parts such that M/P is a positive integer, wherein P sets of different clock signals are provided, each of said P sets being made up of N different clock signals and arranged to drive a respective one of said P parts so as to enable inputting a series of digital pulse data to said matrix and of outputting a series of digital pulse data from said matrix, wherein each of said N different clock signals has a same period T and said N different clock signals are sequentially phase shifted one after another by a time T/N, wherein each pulse of said digital pulse data are also separated by said time T/N, wherein each of said N different clock signals is maintained within a related pulse or delayed pulse of said digital pulse data, and wherein each of said N different clock signals drives each write terminal of M/P storage cells of a related row and drives each read terminal of M storage cells of the next row, each of the P clock signals driving the same row of said matrix being sequentially phase shifted by a fixed time, and said fixed time still maintaining each of said clock signals within said related pulse or delayed pulse of said digital pulse data, while said digital pulse data is inputted into each input terminal of the storage cells of the first column, each output terminal of the storage cells in each column are interconnected to an inverter, and an output of said inverter is connected to each input terminal of the storage cells of the next column.

7. An echo IC as claimed in claim 6, wherein each of said storage cells includes only NMOS transistors.

8. An echo IC as claimed in claim 7, wherein a number of said NMOS transistors in each of said storage cells is three.

9. An echo IC as claimed in claim 6, wherein each of said storage cells includes only PMOS transistors.

10. An echo IC as claimed in claim 9, wherein a number of said PMOS transistors in each of said storage cells is three.

* * * * *